US008283713B2

(12) United States Patent
Jansen et al.

(10) Patent No.: US 8,283,713 B2
(45) Date of Patent: Oct. 9, 2012

(54) LOGIC-BASED EDRAM USING LOCAL INTERCONNECTS TO REDUCE IMPACT OF EXTENSION CONTACT PARASITICS

(75) Inventors: John G. Jansen, Macungie, PA (US); Chi-Yi Kao, San Jose, CA (US); Ce Chen, Milpitas, CA (US); Shahriar Moinian, New Providence, NJ (US)

(73) Assignee: LSI Corporation, Milpitas, CA (US)

( * ) Notice: Subject to any disclaimer, the term of this patent is extended or adjusted under 35 U.S.C. 154(b) by 0 days.

(21) Appl. No.: 13/046,973

(22) Filed: Mar. 14, 2011

(65) Prior Publication Data
US 2011/0298026 A1 Dec. 8, 2011

Related U.S. Application Data

(60) Provisional application No. 61/350,494, filed on Jun. 2, 2010.

(51) Int. Cl.
*H01L 27/108* (2006.01)
(52) U.S. Cl. .................. 257/296; 257/211; 438/622
(58) Field of Classification Search .................. 257/211, 257/296, 203, 390, 306; 438/622
See application file for complete search history.

(56) References Cited

U.S. PATENT DOCUMENTS

| | | | |
|---|---|---|---|
| 6,140,174 A * | 10/2000 | Kwon et al. ................... | 438/241 |
| 6,429,476 B2 * | 8/2002 | Suzuki et al. ................. | 257/296 |
| 6,436,763 B1 | 8/2002 | Huang et al. | |
| 6,656,785 B2 * | 12/2003 | Chiang et al. ................. | 438/240 |
| 6,906,372 B2 * | 6/2005 | Yamada et al. ............... | 257/301 |
| 7,745,867 B2 | 6/2010 | Houston | |
| 2002/0132467 A1 * | 9/2002 | Fischer et al. ................ | 438/621 |
| 2004/0201053 A1 * | 10/2004 | Tu et al. ........................ | 257/296 |
| 2008/0048226 A1 * | 2/2008 | Heo et al. ...................... | 257/295 |
| 2008/0121942 A1 * | 5/2008 | Liaw ............................. | 257/211 |
| 2009/0315124 A1 | 12/2009 | Chen et al. | |
| 2010/0127316 A1 * | 5/2010 | Tu et al. ........................ | 257/296 |
| 2011/0121372 A1 * | 5/2011 | Kang et al. .................... | 257/296 |

* cited by examiner

*Primary Examiner* — Marcos D. Pizarro
*Assistant Examiner* — Bilkis Jahan

(57) ABSTRACT

An electronic device includes an active layer located over a substrate with the active layer having a logic circuit and an eDRAM cell. The electronic device also includes a first metallization level located over the active layer that provides logic interconnects and metal capacitor plates. The logic interconnects are connected to the logic circuit and the metal capacitor plates are connected to the eDRAM cell. The electronic device additionally includes a second metallization level located over the first metallization level that provides an interconnect connected to at least one of the logic interconnects, and a bit line that is connected to the eDRAM cell. A method of manufacturing an electronic device is also included.

22 Claims, 12 Drawing Sheets

US 8,283,713 B2

LOGIC-BASED EDRAM USING LOCAL INTERCONNECTS TO REDUCE IMPACT OF EXTENSION CONTACT PARASITICS

CROSS-REFERENCE TO RELATED APPLICATION

This application claims the benefit of U.S. Provisional Application Ser. No. 61/350,494, filed by John G. Jansen, Chiyi Kao, Ce Chen and Shahriar Moinian on Jun. 2, 2010, entitled "CUB eDRAM Cell With Local Interconnects To Reduce Stacked Contact Parasitics Impact," commonly assigned with this application and incorporated herein by reference.

TECHNICAL FIELD

This application is directed, in general, to an integrated circuit and, more specifically, to an electronic device and a method of manufacturing an electronic device.

BACKGROUND

Embedded Dynamic Random Access Memory (DRAM) typically employs Metal-Insulator-Metal (MIM) capacitors for data storage. These MIM capacitors have large aspect ratio cylindrical shapes that require placement in an integrated circuit metal stack. In current applications, a configuration of an embedded DRAM cell employs an MIM capacitor located under a bit line serving the embedded DRAM cell. This MIM capacitor arrangement is usually referred to as Capacitor-Under-Bitline (CUB). To accommodate this arrangement, the first metallization level in the integrated circuit has to be raised higher forcing contacts to be extended. Associated circuits typically operate more slowly employing this embedded DRAM process due to higher contact to contact parasitic capacitance. Improvement in this area would be beneficial to the art.

SUMMARY

Embodiments of the present disclosure provide an electronic device and a method of manufacturing an electronic device. In one aspect, the electronic device includes an active layer located over a substrate with the active layer having a logic circuit and an eDRAM cell. The electronic device also includes a first metallization level located over the active layer that provides logic interconnects and capacitor plates. The logic interconnects are connected to the logic circuit and the capacitor plates are connected to the eDRAM cell. The electronic device additionally includes a second metallization level located over the first metallization level that provides an interconnect connected to at least one of the logic interconnects, and a bit line that is connected to the eDRAM cell.

In another aspect, the method of manufacturing an electronic device includes providing an active layer located over a substrate where the active layer includes a logic circuit and an eDRAM cell. The method of manufacturing an electronic device also includes locating a first metallization level over the active layer that comprises logic interconnects and capacitor plates. The logic interconnects are connected to the logic circuit and the capacitor plates are connected to the eDRAM cell. The method of manufacturing an electronic device additionally includes locating a second metallization level over the first metallization level that includes an interconnect connected to at least one of the logic interconnects, and a bit line that is connected to the eDRAM cell.

The foregoing has outlined preferred and alternative features of the present disclosure so that those skilled in the art may better understand the detailed description of the disclosure that follows. Additional features of the disclosure will be described hereinafter that form the subject of the claims of the disclosure. Those skilled in the art will appreciate that they can readily use the disclosed conception and specific embodiment as a basis for designing or modifying other structures for carrying out the same purposes of the present disclosure.

BRIEF DESCRIPTION

Reference is now made to the following descriptions taken in conjunction with the accompanying drawings, in which:

FIG. 1 illustrates a block diagram of a System On Chip employing logic-based embedded DRAM constructed according to the principles of the present disclosure;

FIG. 2 illustrates a sectional diagram of an embodiment of a semiconductor integrated circuit electronic device 200 at one stage of manufacture that includes an eDRAM cell 209 and a logic circuit 224 constructed according to the principles of the present disclosure.

DETAILED DESCRIPTION

Figure 1:
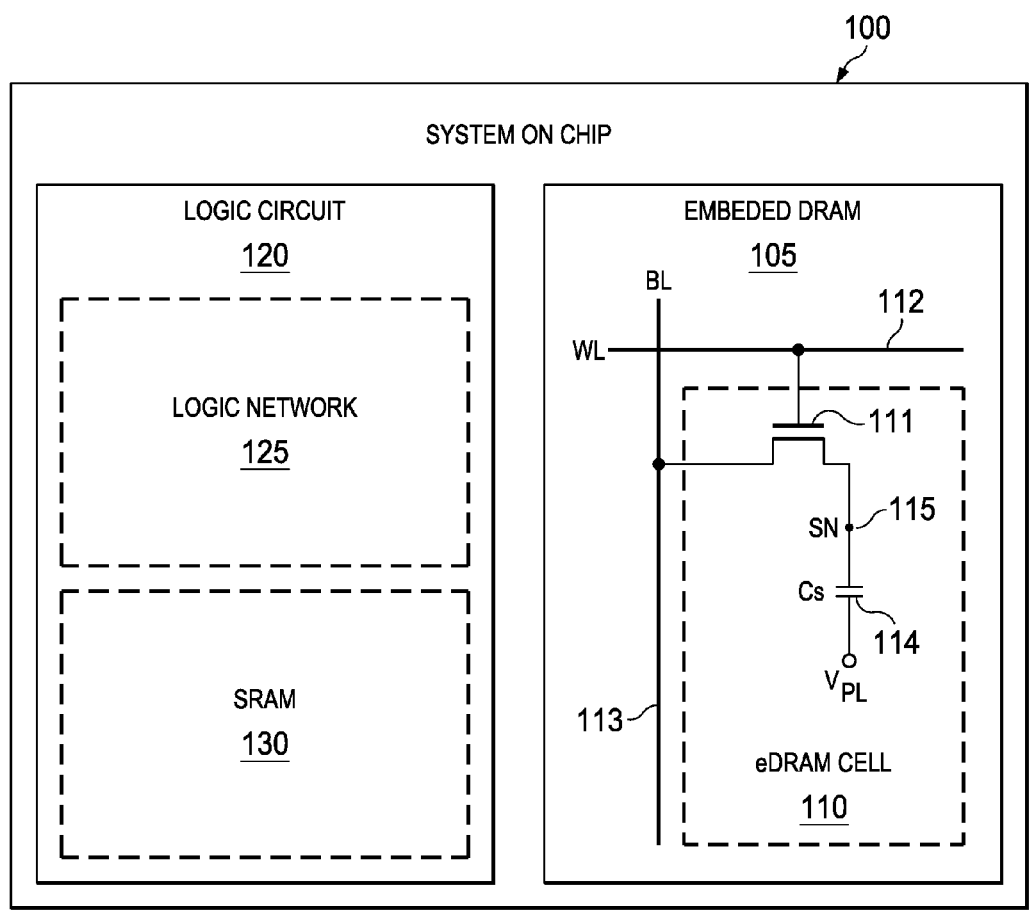

FIG. 1 illustrates a block diagram of a System On Chip employing logic-based embedded DRAM, generally designated 100, constructed according to the principles of the present disclosure. The System On Chip (SOC) 100 includes an embedded DRAM (eDRAM) 105 and logic circuitry 120 employing a logic network 125 and a static random access memory (SRAM) 130.

The eDRAM 105 employs an array of eDRAM cells wherein an eDRAM cell 110 is typical. The eDRAM cell 110 includes a pass transistor 111 connected to a word line 112 and a bit line 113 that are provided to activate writing into and reading from the eDRAM cell 110. The pass transistor 111 is further connected to a storage capacitor (Cs) 114 to provide a storage node (SN) 115 for data storage. The storage capacitor 114 is further connected to a top plate voltage ($V_{PL}$), as shown. In the illustrated embodiment, the storage capacitor 114 is an MIM capacitor that is physically located under the bit line 113 (i.e., a CUB structure).

The logic network 125 generally includes logic gates (e.g., AND, OR, NAND or NOR gates, etc.) that may be designed around a particular type of logic, such as CMOS logic. Alternately, the logic network 125 may be a combination of various types of logic or logic arrays. Additionally, the SRAM 130 typically employs multiple SRAM cells that may use a same number of transistors or a combination of SRAM cells having a different number of transistors as appropriate to an application.

Figure 2:
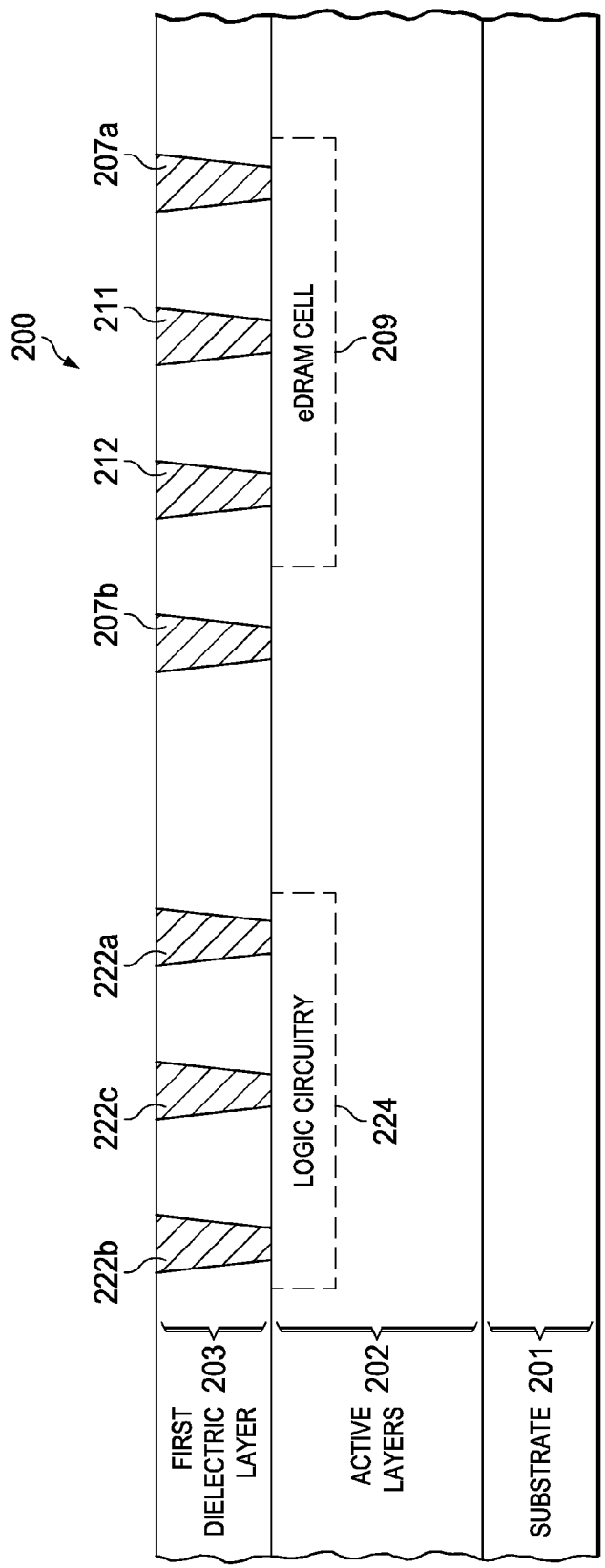

FIG. 2 illustrates a sectional diagram of an embodiment of a semiconductor integrated circuit electronic device 200 at one stage of manufacture that includes an eDRAM cell 209 and a logic circuit 224 constructed according to the principles of the present disclosure. The electronic device 200 includes a substrate 201 having active layers 202 formed above it. The active layers 202 include portions of the eDRAM cell 209 and the logic circuit 224 that are typically formed of active and passive electronic components, such as transistors, resistors and capacitors, for example. Moreover, conventional processes and materials may be used to fabricate the active layer 202 and its components.

A first dielectric layer 203 is formed above the active layer 202 and includes first eDRAM contacts 207a, 207b, 211, 212 as well as first logic contacts 222a, 222b 222c. Formation of these first logic and eDRAM contacts may employ conventional fabrication techniques and materials for fabricating contact plugs or vias, which often includes metal liners formed of tantalum nitride, tungsten or titanium nitride, for example that serve as barrier/adhesion layers. As seen in FIG. 2, the first eDRAM contacts 207a, 211 and 212 make contact with the eDRAM cell 209, while first logic contacts 222a through 222c make contact with the logic circuit 224. Here, the first eDRAM contact 207b may be employed to make contact to another eDRAM cell (not specifically shown in FIG. 2).

Figure 3:
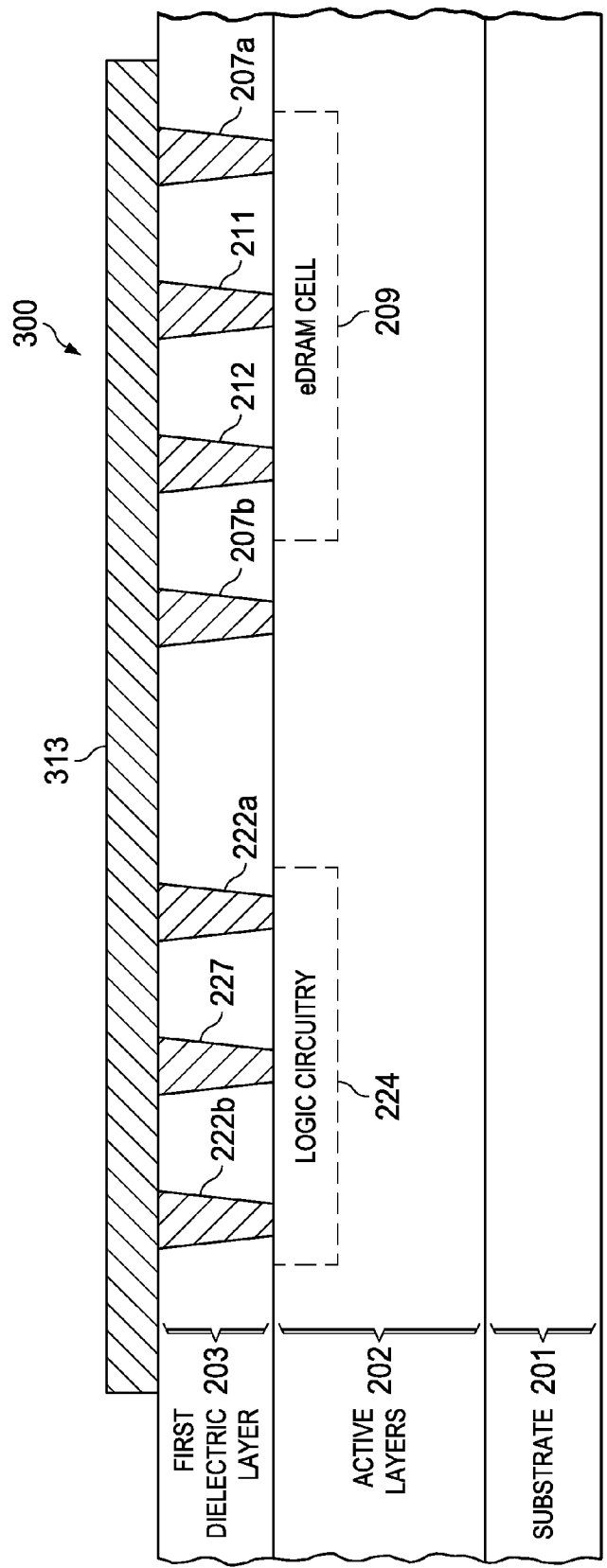
FIG. 3 illustrates a sectional diagram of a first metallization level that is deposited over the active layers and the first dielectric layer.

FIG. 3 illustrates a sectional diagram of a conductive layer 313 deposited over or on the active layers 202 and the first dielectric layer 203. Whenever used in this disclosure or the claims, a layer is considered to be on another layer even though intervening barrier or diffusion layers may be located between the two layers. The conductive layer 313 may be comprised of conventional conductive metals, (such as copper, aluminum or a contact material such as tungsten that may be used as a local interconnect) that are deposited by conventional methods such as, physical vapor deposition (PVD) or chemical vapor deposition (CVD) processes, etc. However, the conductive layer 313 may also be comprised of other conventional materials, such as doped silicon, or other conductive materials known to those skilled in the art.

For purposes of this disclosure, a local interconnect is defined as one that provides connection within a logic circuit or an eDRAM cell. Correspondingly, a global interconnect is defined as one that provides connection between more than one logic circuit or more than one eDRAM cell.

Figure 4:
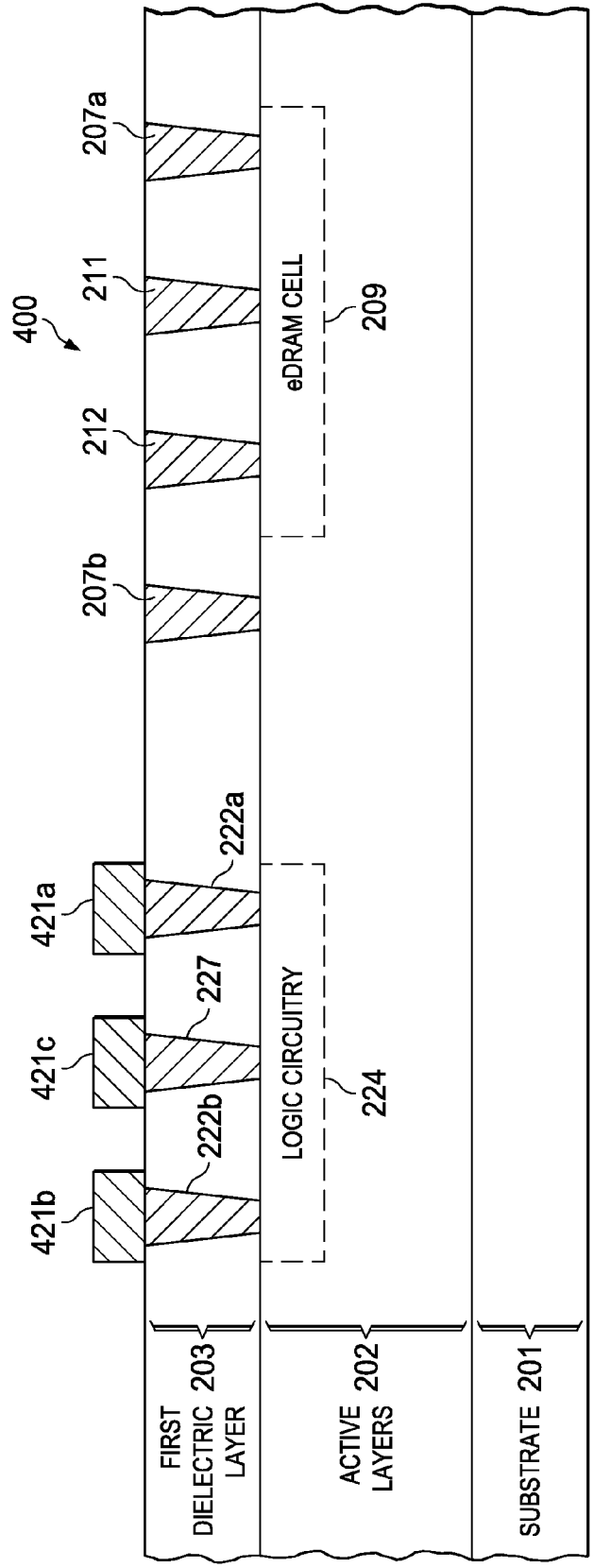
FIG. 4 illustrates a sectional diagram of logic interconnects that are patterned in the first metallization level of FIG. 3.

FIG. 4 illustrates a sectional diagram of logic interconnects 421a, 421b, 421c that are patterned from the conductive layer 313 of FIG. 3. The logic interconnects 421a, 421b, 421c, which may be metal runners or lines, respectively contact the logic contacts 222a, 222b, 222c to provide interconnections for them. The logic interconnects 421a, 421b, 421c may be patterned from the conductive layer 313 employing conventional photolithographic and resist pattern deposition and removal techniques.

Figure 5:
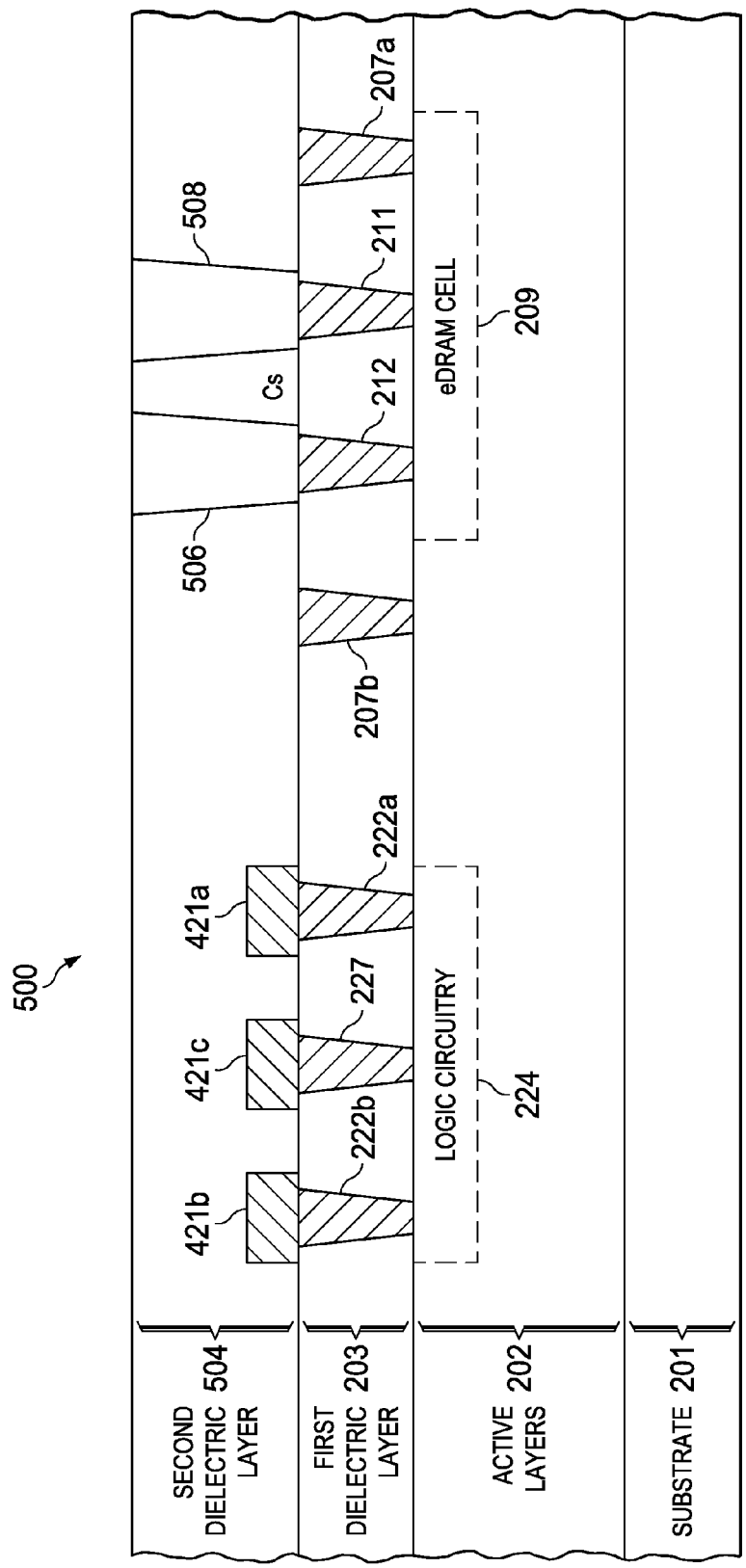
FIG. 5 illustrates a sectional diagram of the device shown in FIG. 4 after the deposition of a second dielectric layer over the logic interconnects and the first dielectric layer.

FIG. 5 illustrates a sectional diagram of the device shown in FIG. 4 after the deposition of a second dielectric layer 504 over the logic interconnects 421a through 421c and the first dielectric layer 203. The second dielectric layer 504 may be deposited or formed using conventional processes and materials. Also shown are capacitor plate trenches 506, 508 that have been formed in the second dielectric layer 504. Conventional patterning and etching processes may be used to form the trenches 506, 508. When filled with the appropriate conductive material, such as metal, and their fabrication are complete, the resulting capacitor plates will function as a storage capacitor Cs of the eDRAM cell 209 as discussed with respect to FIG. 1.

Figure 6:
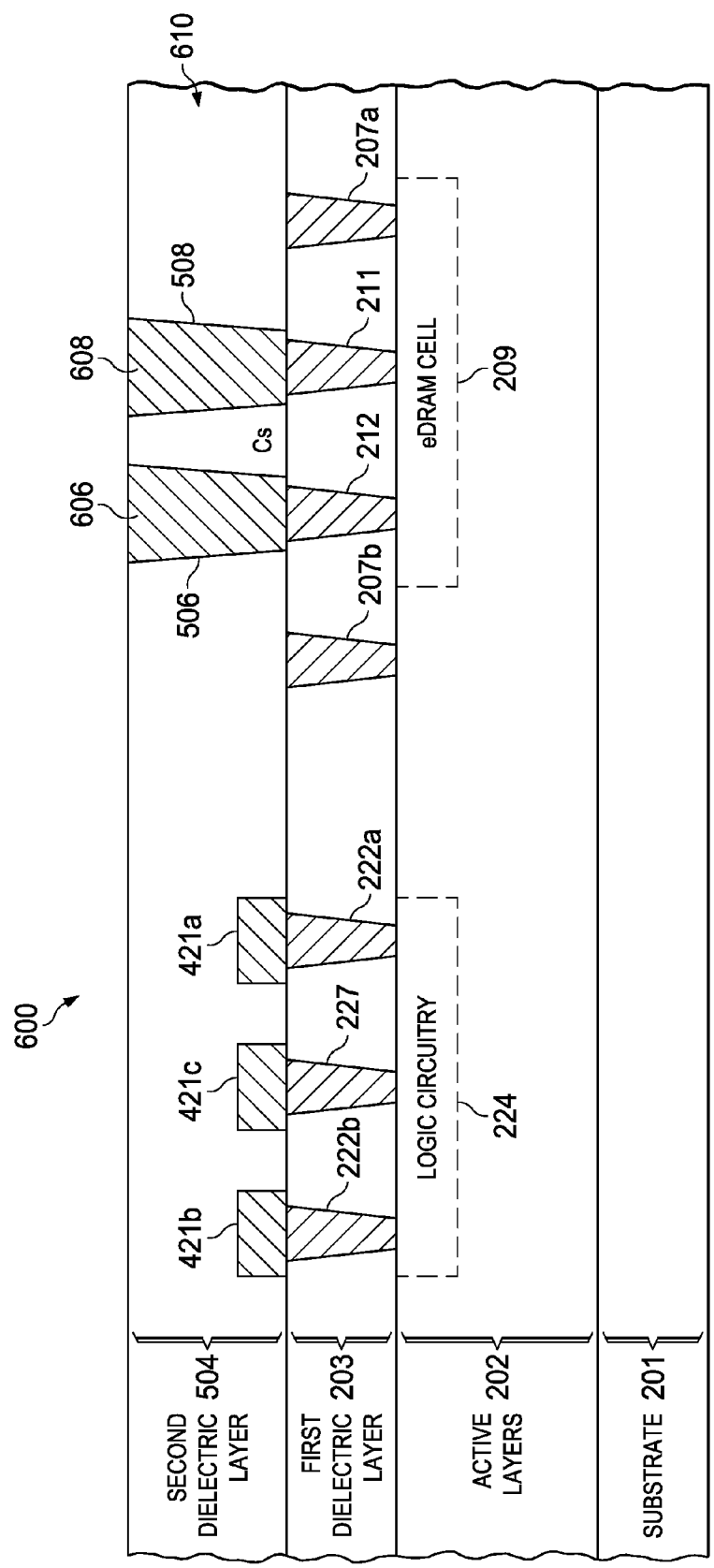
FIG. 6 illustrates the device of FIG. 5, after capacitor plate trenches have been conventionally filled with a conductive material.

FIG. 6 illustrates the device of FIG. 5, after the capacitor plate trenches 506, 508 have been conventionally filled with a conductive material, such as metal (e.g., copper), or another conductive material that may be used to form capacitor plates. In such processes, a conductive layer, which is not shown, is blanket deposited over the surface of the second dielectric layer 504 and in the trenches 506, 508, after the deposition of an optional liner or barrier/adhesion layer within each of the trenches 506, 508. The excess conductive material may be removed from the surface of the second dielectric layer 504 using conventional processes, such as polishing processes, etc., thereby resulting in the formation of the capacitor plates 606, 608.

The logic interconnects 421a, 421b, 421c, and the capacitor plates 606, 608 comprise a metallization level 610. Even though they may be formed in separate deposition steps, it should be noted that the logic interconnects 421a, 421b, 421c, and the capacitor plates 606, 608 are considered to be within the same metallization (i.e. conductive) level, since they are located within the same dielectric layer 504. This provides the advantage of having logic interconnects present within the same layer as the capacitor plates that allow shorter contact legs or segments to be used to contact the logic circuit 224, which in turn, helps reduce parasitic capacitance. Further, the metallization level 610 is considered to be a pre-metal dielectric level (PDL) metallization level, because it is located between the active devices of the logic circuitry 224 and the multiple and overlying primary metallization levels that are used to interconnect various circuits within the electronic device 100.

Figure 7:
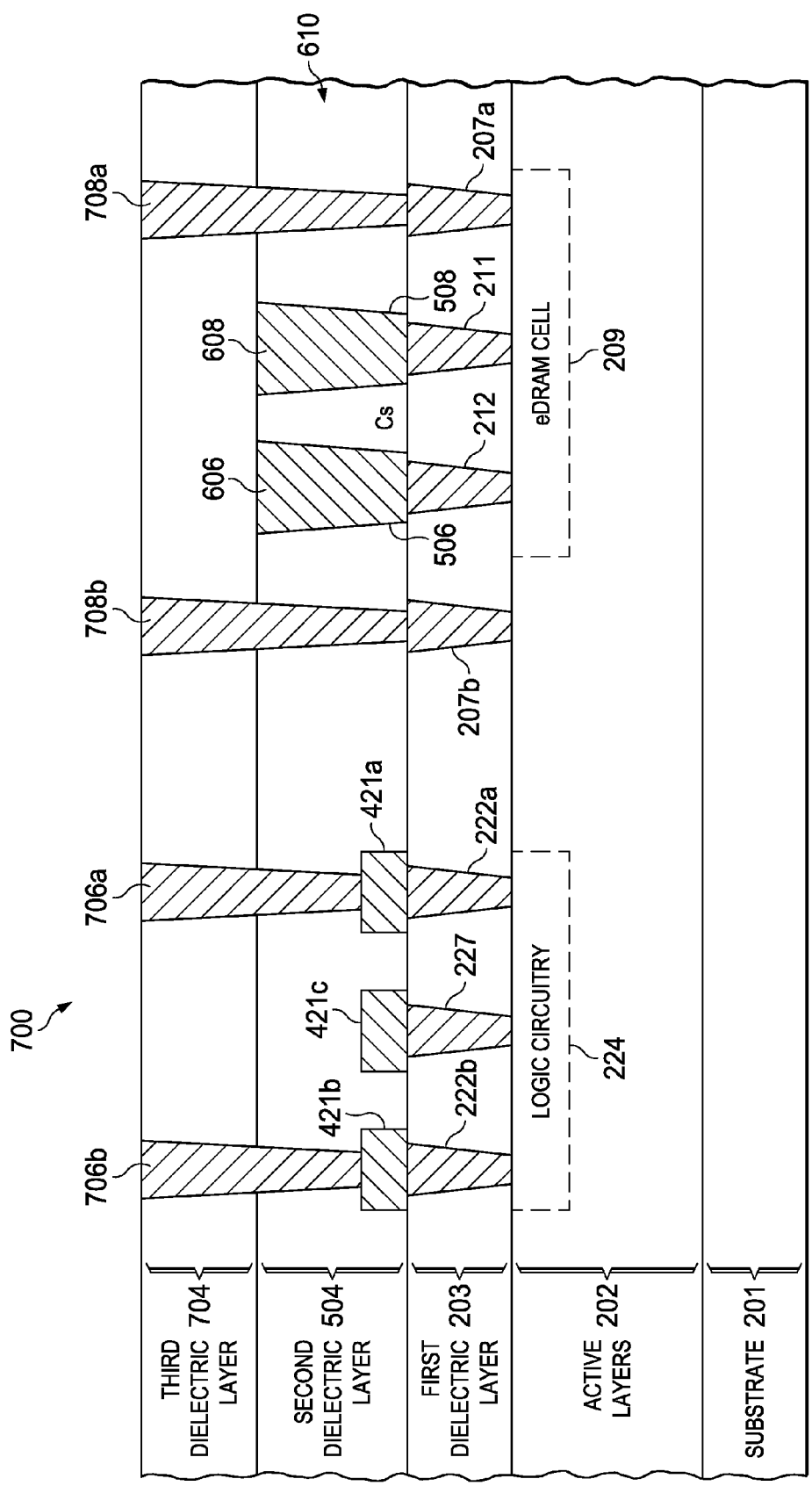
FIG. 7 illustrates the embodiment of FIG. 6 after the deposition or formation of a third dielectric layer over the second dielectric layer, the logic interconnects and the capacitor plates 606, 608.

FIG. 7 illustrates the embodiment of FIG. 6 after the deposition or formation of a third dielectric layer 704 over the second dielectric layer 504 and logic interconnects 421a, 421b, 421c, and the capacitor plates 606, 608. As with previous embodiments, the third dielectric layer 704 may be formed using conventional deposition processes and materials. Second logic contacts 706a, 706b and second eDRAM contacts 708a, 708b are also shown in FIG. 7. These contacts 706a, 706b and 708a, 708b may also be formed using conventional etching, deposition, and photolithographic processes. As seen in this embodiment, second logic contacts 706a, 706b extend through the third and second dielectric layers 704, 504 to contact the logic interconnects 421a, 421b, respectively.

This structure is in contrast to conventional devices, where the logic interconnects 421a, 421b and 421c are not present. For the conventional case, the second logic contacts 706a, 706b would have to extend through the third dielectric layer 704 and the second dielectric 504 to the first dielectric layer 203 to respectively form stacked contacts with the first logic contacts 222a, 222b, which increases unwanted parasitic capacitance.

In current configurations of stacked MIM CUB embedded eDRAM, a conventional metallization layer is raised higher (e.g., metallization level 812 of FIG. 8 below) causing contacts to lengthen as compared with a non-eDRAM process. Associated logic circuits and SRAM operate more slowly in this eDRAM process environment due to higher contact to contact parasitic capacitance. Inserting the logic interconnects 421a, 421b, 421c, below this raised conventional first metallization layer provides a metallization level and first contact height for logic circuits and SRAM arrays that more closely corresponds to a non-eDRAM environment thereby reducing eDRAM process impact.

The present disclosure also provides embodiments that allow logic contacts to be offset from one another along their respective logic interconnects thereby effectively reducing parasitic capacitance for the logic circuit 224, which is an additional improvement over conventional devices. This offset capability will be further discussed with respect to FIGS. 11A, 11B below. Alternatively, in this embodiment, eDRAM cell structure is not changed from conventional configurations where the second eDRAM contacts 708a, 708b provide stacked contacts with the first eDRAM contacts 207a, 207b thereby providing minimal or no adjustment in unwanted parasitic capacitance for the eDRAM cell 209.

Figure 8:
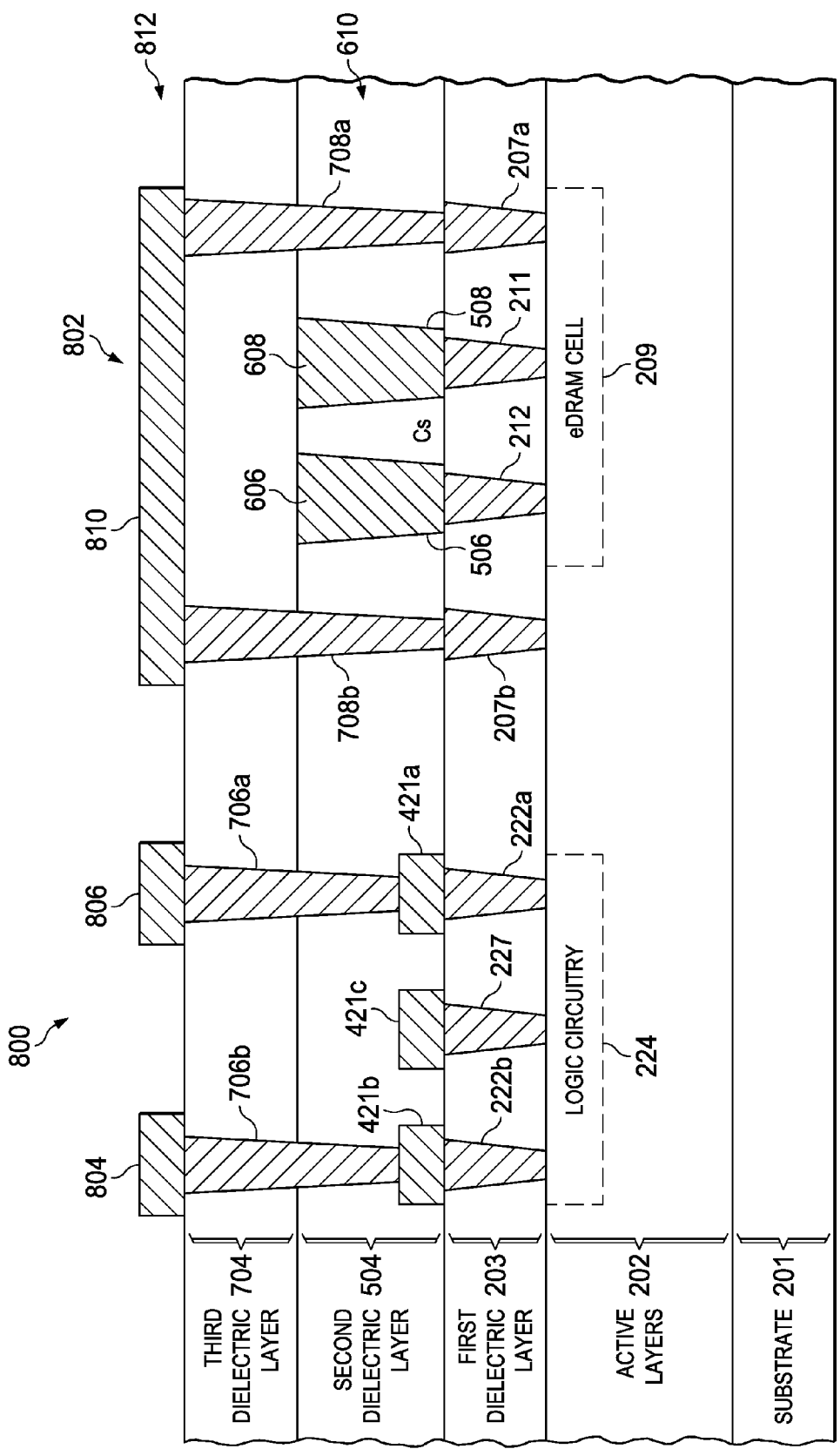
FIG. 8 illustrates a sectional diagram of interconnects and a bit line patterned from a second conductive layer, such as the materials previously described above regarding the conductive layer of FIG. 3.

FIG. 8 illustrates a sectional diagram of interconnects 804, 806 and a bit line 810 patterned from a second conductive layer 802, such as the materials previously described above regarding the conductive layer 313. The second conductive layer 802 is located over the metallization level 610 and is patterned to provide the interconnects 804, 806 that are connected to the logic interconnects 421b, 421a through the second logic contacts 706b, 706a, respectively. The interconnects 804, 806 and bit line 810 comprise another metallization level 812 and are located within a same dielectric layer, which is not specifically shown in FIG. 8. In some embodiments, the metallization level 812 may be considered to be the first metallization level of the previously mentioned primary metallization levels. The bit line 810 is connected to first eDRAM contacts 207a, 207b, as shown. Here, the bit line connection provided by first and second eDRAM contacts 207b, 708b may be employed to connect the bit line 810 to another eDRAM cell (not shown in FIG. 8). After the structure shown in FIG. 8 is completed, multiple dielectric layers and interconnects and contacts can be formed over this device to complete the fabrication of the electronic device 100. Additionally, the logic interconnects 421a, 421b, 421c may be employed as local or global interconnects for the logic circuit 224, as will be further defined with respect to FIG. 10 below.

Figure 9:
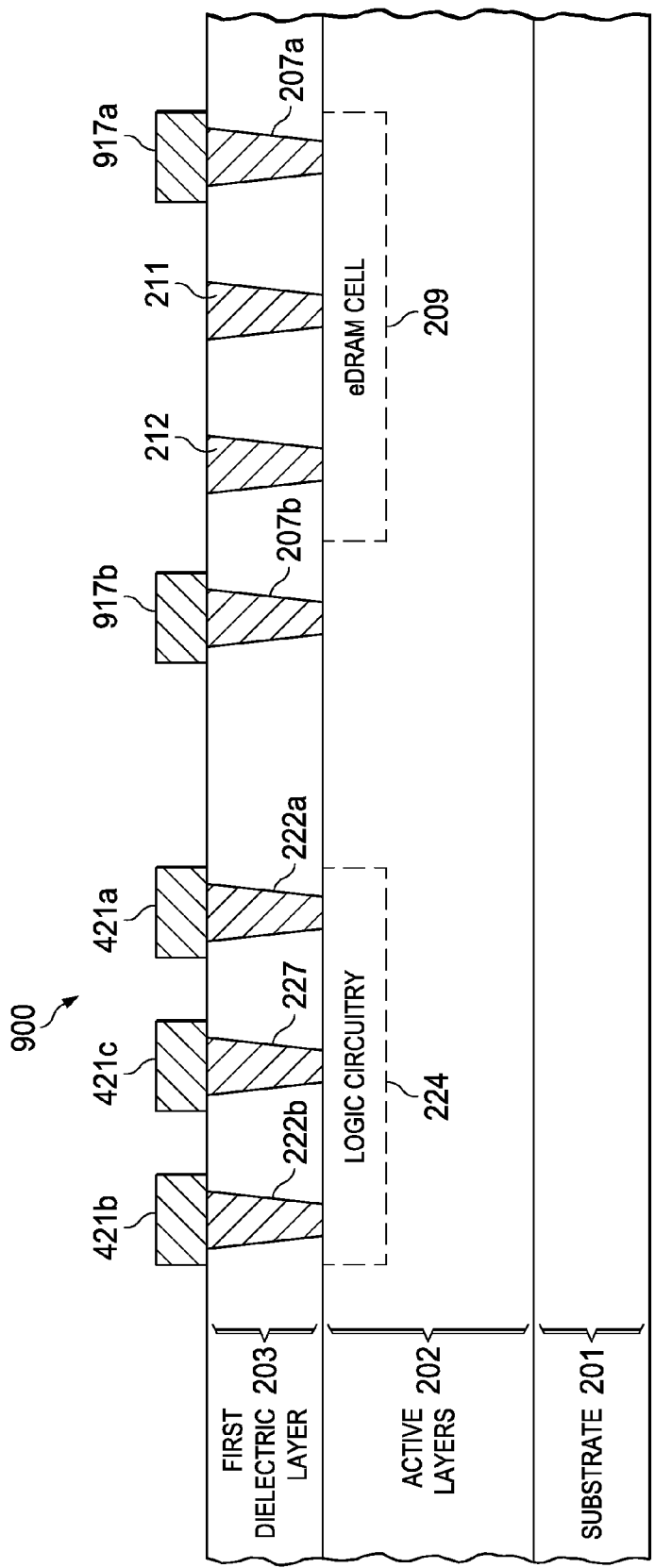
FIG. 9 illustrates a sectional diagram of another embodiment showing eDRAM interconnects that are also patterned from the conductive layer of FIG. 3.

FIG. 9 illustrates a sectional diagram of another embodiment showing eDRAM interconnects 917a, 917b that also may be patterned from the conductive layer 313 of FIG. 3. The eDRAM interconnects 917a, 917b respectively contact first eDRAM contacts 207a, 207b and are employed in an embodiment of an eDRAM cell discussed below. The eDRAM interconnects 917a, 917b are on the same level and may be patterned at the same time as the logic interconnects 421a, 421b 421c employing techniques discussed with respect to FIG. 4.

Figure 10:
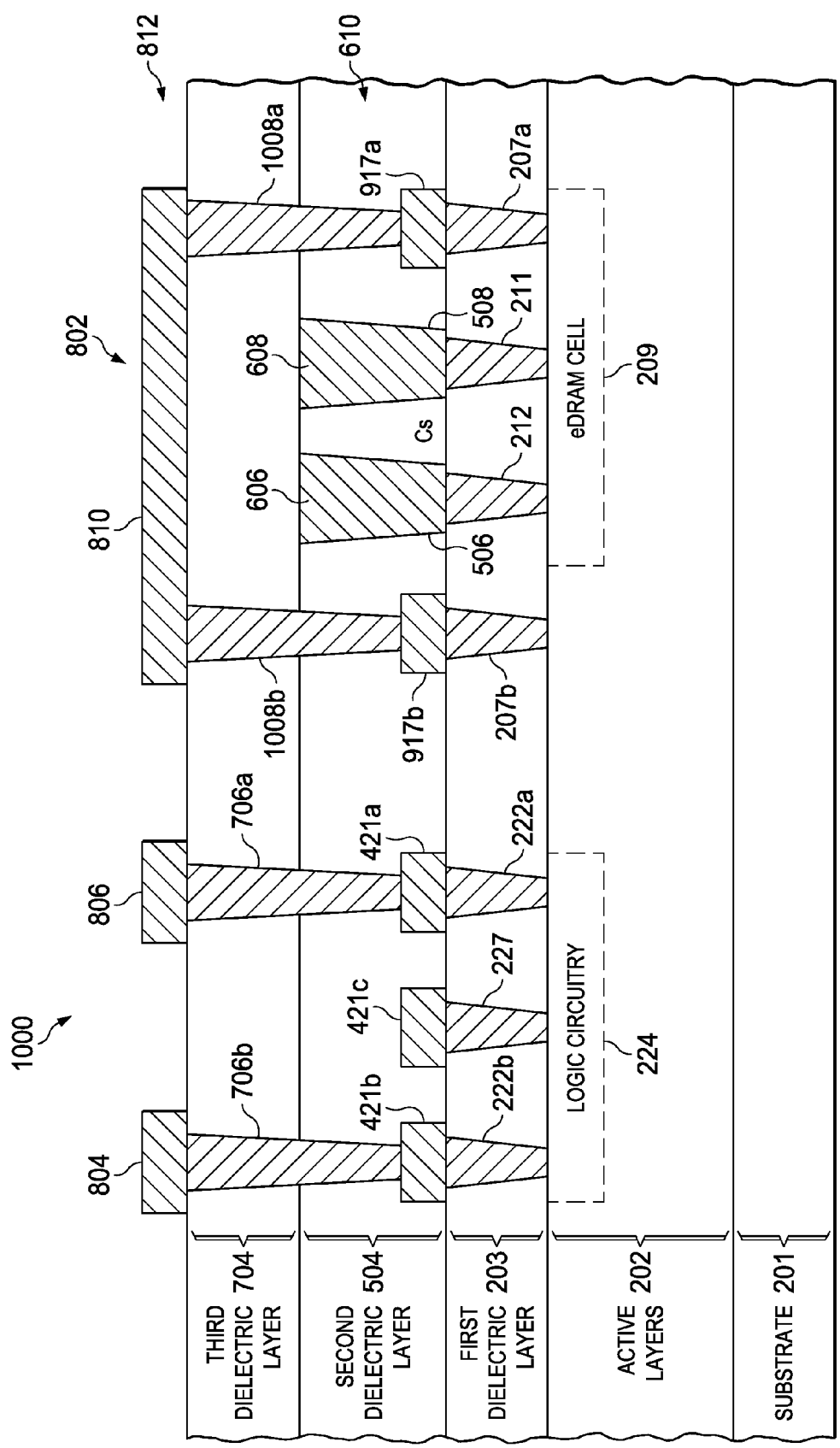
FIG. 10 illustrates a sectional diagram of an embodiment that is based on the eDRAM interconnects discussed with respect to FIG. 9.

FIG. 10 illustrates a sectional diagram of an embodiment that is based on the eDRAM interconnects 917a, 917b discussed with respect to FIG. 9. The structure shown in FIG. 10 may be completed by employing the techniques discussed with respect to FIGS. 5, 6, 7 and 8 with the exception that here, the bit line 810 is connected to the eDRAM interconnects 917a, 917b through shortened second eDRAM contacts 1008a, 1008b.

After the structure shown in FIG. 10 is completed, multiple dielectric layers and interconnects and contacts can be formed over this device to complete the fabrication of the electronic device 100. The logic interconnects 421a, 421b, 421c and the eDRAM interconnects 917a, 917b may be employed as local or global interconnects for the logic circuit 224 or the eDRAM cell 209.

Figure 11A:
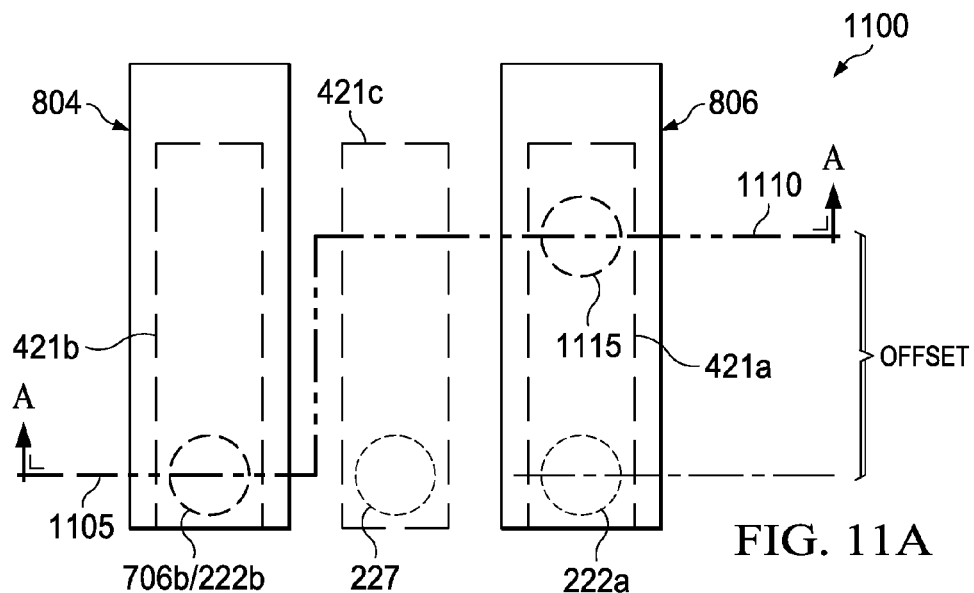
FIGS. 11A and 11B illustrate an alternative embodiment of a portion of the logic circuit employing an offset second logic contact.
Figure 11B:
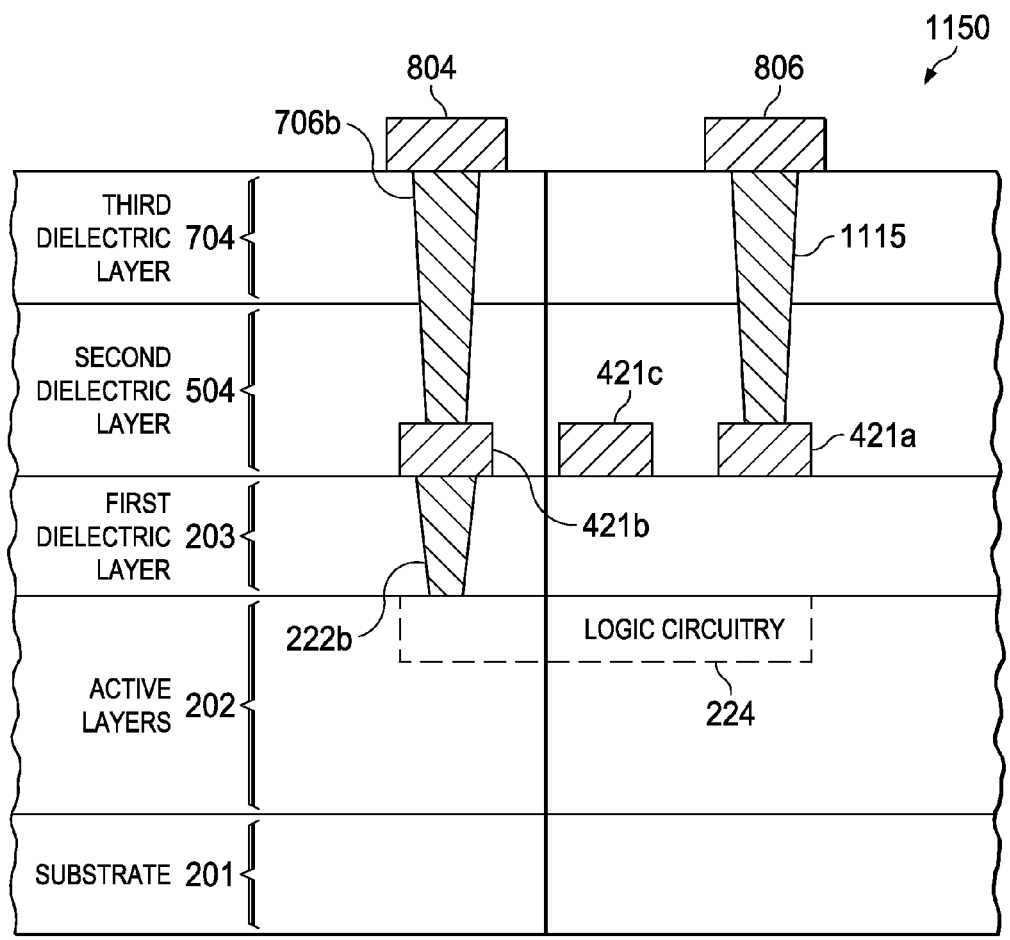

FIGS. 11A and 11B illustrate an alternative embodiment of a portion of the logic circuit 224, generally designated 1100 and 1150, employing an offset second logic contact. FIG. 11A shows a top view 1100 of the portion of the logic circuit 224, and FIG. 11B shows an offset sectional diagram 1150 corresponding to a partial section view AA of the top view 1100. The partial section view AA includes a forward plane 1105 and a recessed plane 1110. The forward plane 1105 is represented on the left of the offset sectional diagram 1150 and the recessed plane 1110 is represented on its right, as shown. The portion of the logic circuit 224 includes the first logic contacts 222a, 222b, 227, logic interconnects 421a, 421b, 421c, the second logic contact 706b and the interconnects 804, 806 as shown in FIGS. 8 and 10. The portion of the logic circuit 224 also includes an offset second logic contact 1115 instead of the second logic contact 706a shown in FIGS. 8 and 10.

It may be seen in the top view 1100 of FIG. 11A that the offset second logic contact 1115 is offset along the logic interconnect 421a with respect to the first logic contact 222a and the second logic contact 706b. This offset provides a greater distance or spacing compared to the second logic contact 706a located directly over (or actually contacting if the logic interconnect 421a were not present) the first logic contact 222a in FIGS. 8 and 10. This offset spacing provides a reduced parasitic capacitance between the second logic contacts 1115, 706b as compared to a parasitic capacitance that would be provided by no contact offset.

Of course, the above discussion related to FIGS. 11A and 11B is also applicable to eDRAM interconnects and corresponding offset second eDRAM contacts. Generally, the use of logic and eDRAM interconnects between first and second contacts are also examples of local interconnect applications, even without the use of contact offsets.

Figure 12:
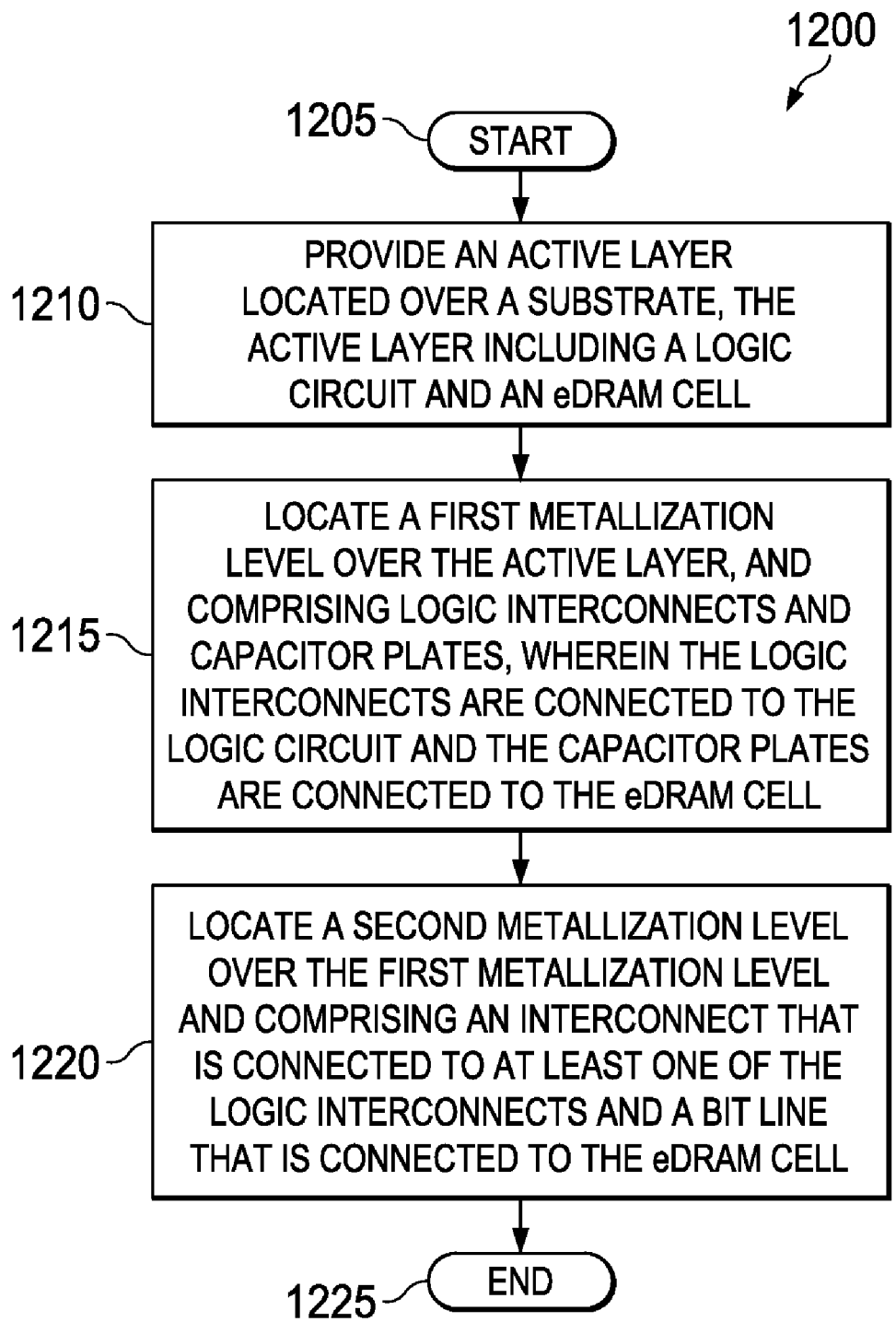
FIG. 12 illustrates a flow diagram of an embodiment of a method of manufacturing an electronic device carried out according to the principles of the present disclosure.

FIG. 12 illustrates a flow diagram of an embodiment of a method of manufacturing an electronic device, generally designated 1200, carried out according to the principles of the present disclosure. The method 1200 starts in a step 1205, and an active layer located over a substrate is provided wherein the active layer includes a logic circuit and an eDRAM cell, in a step 1210. As used herein and in the claims, provided or providing includes those instances where the device or component is either manufactured within the same facility, or a different facility, including third party manufacturing facilities. The logic circuit is a logic network or a static random access memory (SRAM).

Then, a first metallization level, which comprises logic local or global interconnects and capacitor plates, is located over the active layer, wherein the logic interconnects are connected to the logic circuit and the capacitor plates are connected to the eDRAM cell, in a step 1215. A second metallization level is located over the first metallization level having an interconnect connected to at least one of the logic interconnects and a bit line that is connected to the eDRAM cell, in a step 1220.

The first metallization level is located over a first dielectric layer having logic contacts formed therein that contact the logic circuit and eDRAM contacts that contact the eDRAM cell. The logic contacts that contact the logic circuit are first logic contacts and the eDRAM contacts are first eDRAM contacts. Further, a second dielectric is located over the first metallization level that has second logic contacts and second eDRAM contacts formed therein. One embodiment further includes off-setting at least one of the second logic contacts from a corresponding one of the first logic contacts. In one embodiment, locating the first metallization level further includes locating eDRAM interconnects over the active area, the eDRAM interconnects contacting the first eDRAM contacts and wherein forming the second eDRAM contacts includes contacting the second eDRAM contacts to the eDRAM interconnects. Generally, the logic interconnects and the eDRAM interconnects are employed as local or global interconnects. The method 1200 ends in a step 1225.

While the method disclosed herein has been described and shown with reference to particular steps performed in a particular order, it will be understood that these steps may be combined, subdivided, or reordered to form an equivalent method without departing from the teachings of the present disclosure. Accordingly, unless specifically indicated herein, the order or the grouping of the steps is not a limitation of the present disclosure.

Those skilled in the art to which this application relates will appreciate that other and further additions, deletions, substitutions and modifications may be made to the described embodiments.

What is claimed is:

1. An electronic device, comprising:
   an active layer located over a substrate, the active layer including a logic circuit and an eDRAM cell;
   a first dielectric layer located on the active layer and a second dielectric layer located on the first dielectric layer;
   a first metallization level located on the first dielectric layer, the first metallization level including first logic interconnect lines on the first dielectric layer and a capacitor on the first dielectric layer, wherein the first logic interconnect lines are connected to the logic circuit through first logic contacts passing through the first dielectric layer and first and second metal capacitor plates of the capacitor are separately connected to the eDRAM cell through capacitor contacts passing through the first dielectric layer; and
   a second metallization level located on the second dielectric layer, the second metallization level including second logic interconnect lines on the second dielectric layer, wherein the second logic interconnect lines are connected to the logic circuit through second logic contacts passing though the second dielectric layer, and a bit line on the second dielectric layer that is connected to the eDRAM cell.

2. The electronic device recited in claim 1, wherein the second logic contacts contact the first logic contacts through the first logic interconnect lines.

3. The electronic device recited in claim 1, wherein the bit line is connected to the eDRAM cell through first eDRAM contacts that pass through the first dielectric layer and through second eDRAM contacts that pass through the second dielectric layer.

4. The electronic device recited in claim 3, wherein the second eDRAM contacts directly contact the first eDRAM contacts.

5. The electronic device recited in claim 3, wherein the first metallization level further comprises eDRAM interconnect lines on the first dielectric layer and the second eDRAM contacts contact the first eDRAM contacts through the eDRAM interconnect lines.

6. The electronic device recited in claim 5, wherein at least one of the second eDRAM contacts contacting a corresponding one of the first eDRAM contacts through one of the eDRAM interconnect lines is laterally offset from the corresponding one of the first eDRAM contacts.

7. The electronic device recited in claim 1, wherein at least one of the second logic contacts contacting a corresponding one of the first logic contacts through one of the first logic interconnect lines is laterally offset from the corresponding one of the first logic contacts.

8. The electronic device recited in claim 1, further including a third dielectric layer located on the second dielectric layer, wherein the second logic contacts, and, second eDRAM contacts connecting the bit line to the eDRAM circuit, both extend through the second and third dielectric layers.

9. The electronic device recited in claim 1, wherein the logic circuit includes a static random access memory (SRAM) or a logic network.

10. The electronic device recited in claim 1, wherein the first and second logic interconnect lines provide a global interconnection between the logic circuit and a different logic circuit or the eDRAM cell or a different eDRAM cell.

11. The electronic device recited in claim 1, wherein the capacitor plates span the second dielectric layer, and bottoms of each of the capacitor plates contact different ones of the capacitor contacts.

12. A method of manufacturing an electronic device, comprising:
    providing an active layer located over a substrate, the active layer including a logic circuit and an eDRAM cell;
    forming a first dielectric layer on the active layer;
    forming a first metallization level on the first dielectric layer, the first metallization level including first logic interconnect lines on the first dielectric layer and a capacitor on the first dielectric layer, wherein the first logic interconnect lines are connected to the logic circuit and first and second capacitor plates of the capacitor are separately connected to the eDRAM cell through capacitor contacts passing through the first dielectric layer;
    forming a second dielectric layer on the first dielectric layer; and
    forming a second metallization level on the second dielectric layer, the second metallization level including second logic interconnect lines on the second dielectric layer, wherein the second logic interconnect lines are connected to the logic circuit through second logic contacts passing though the second dielectric layer, and a bit line on the second dielectric layer that is connected to the eDRAM cell.

13. The method recited in claim 12, wherein the second logic contacts contact the first logic contacts through the first logic interconnect lines.

14. The method recited in claim 12, wherein the bit line is connected to the eDRAM cell through first eDRAM contacts that pass through the first dielectric layer and through second eDRAM contacts that pass through the second dielectric layer.

15. The method recited in claim 14, wherein the second eDRAM contacts directly contact the first eDRAM contacts.

16. The method recited in claim 14, wherein forming the first metallization level further includes forming eDRAM interconnect lines on the first dielectric layer, wherein the second eDRAM contacts contact the first eDRAM contacts through the eDRAM interconnect lines.

17. The method recite in claim 16, wherein at least one of the second eDRAM contacts contacting a corresponding one of the first eDRAM contacts through one of the eDRAM interconnect lines is laterally offset from the corresponding one of the first eDRAM contacts.

18. The method recited in claim 12, wherein at least one of the second logic contacts contacting a corresponding one of the first logic contacts through one of the first logic interconnect lines is laterally offset from the corresponding one of the first logic contacts.

19. The method recited in claim 12, further including forming a third dielectric layer on the second dielectric layer, wherein the second logic contacts, and, the second eDRAM contacts connecting the bit line to the eDRAM circuit, both extend through the second and third dielectric layers.

20. The method recited in claim 12, wherein the logic circuit includes a static random access memory (SRAM) or a logic network.

21. The method recited in claim 12, wherein the first and second logic interconnect lines provide a global interconnection between the logic circuit and a different logic circuit or the eDRAM cell or a different eDRAM cell.

22. The method recited in claim 12, wherein the capacitor plates span the second dielectric layer, and bottoms of each of the capacitor plates contact different ones of the capacitor contacts.

* * * * *